(12) United States Patent
Rouse et al.

(10) Patent No.: US 6,717,141 B1
(45) Date of Patent: Apr. 6, 2004

(54) REDUCTION OF ABERRATIONS PRODUCED BY WIEN FILTER IN A SCANNING ELECTRON MICROSCOPE AND THE LIKE

(75) Inventors: John A. Rouse, Mitcham (GB); Ira Rosenberg, Andover, MA (US); Neal T. Sullivan, Lunenburg, MA (US)

(73) Assignee: Schlumberger Technologies, Inc., San Jose, CA (US)

( * ) Notice: Subject to any disclaimer, the term of this patent is extended or adjusted under 35 U.S.C. 154(b) by 0 days.

(21) Appl. No.: 09/994,563

(22) Filed: Nov. 27, 2001

(51) Int. Cl.[7] .............................. H01J 47/00; H01J 3/14; G01N 23/00
(52) U.S. Cl. .................. 250/306; 250/305; 250/307; 250/310; 250/311; 250/396 R; 250/397; 250/398; 250/492.1; 250/492.3; 250/396 ML
(58) Field of Search ................................ 250/305, 306, 250/307, 310, 311, 396 R, 397, 398, 492.1, 492.3, 396 ML

(56) References Cited

U.S. PATENT DOCUMENTS

| | | | | |
|---|---|---|---|---|
| 3,979,590 A | * | 9/1976 | Andersen | 250/305 |
| 5,369,279 A | * | 11/1994 | Martin | 250/396 R |
| 5,422,486 A | * | 6/1995 | Herrmann et al. | 250/396 R |
| 6,066,852 A | * | 5/2000 | Taya et al. | 250/396 ML |
| 6,150,657 A | * | 11/2000 | Kimoto et al. | 250/305 |
| 6,410,924 B1 | * | 6/2002 | Wang | 250/398 |
| 6,509,569 B1 | * | 1/2003 | Frosien | 250/396 R |

FOREIGN PATENT DOCUMENTS

EP            817235 A1 *  1/1998    ......... H01J/37/244

* cited by examiner

Primary Examiner—John R. Lee
Assistant Examiner—Mary El-Shammaa
(74) Attorney, Agent, or Firm—Cohen, Pontani, Lieberman & Pavane

(57) ABSTRACT

In order to improve the resolution of an electron beam in a scanning electron microscope or the like in which a Wien filter is employed for particle detection purposes, the beam is caused to have an envelope with a crossover point within, and preferably centrally located with respect to, the Wien filter.

31 Claims, 2 Drawing Sheets

REDUCTION OF ABERRATIONS PRODUCED BY WIEN FILTER IN A SCANNING ELECTRON MICROSCOPE AND THE LIKE

FIELD OF THE INVENTION

The present invention is directed to improving the resolution of an electron beam that impacts a sample being imaged by a scanning electron microscope or comparable instruments and, in particular, to minimize aberrations caused by using a Wien filter in the beam column.

BACKGROUND OF THE INVENTION

Various instruments are known which rely on the detection of charged particles emitted from a sample (also commonly referred to as a target) to derive characteristics of the sample. Examples of such instruments are scanning electron microscopes and focused ion beam microscopes.

For facilitating the description of the present invention, it will be explained in connection with a scanning electron microscope ("SEM"). However, it should be understood that the invention is not limited to an SEM and can be applied by one with ordinary skill in the art in other instruments and machines that require a focused beam of charged particles.

An SEM operates by generating a primary, or incident, scanning electron beam that impacts a sample, a surface of which is being imaged. As a result, backscattered and secondary electrons are emitted from the sample surface and collected by a detector which is arranged near the surface of the sample. The detector generates a signal from the electron emission collected from the sample surface as it is exposed to the electron beam. The signal from the detector is typically processed to create an image of the surface which is then displayed on a video screen.

On its way between the electron source and the sample, the incident beam is deflected by various electromagnetic and electrostatic elements that are used to, for example, align, focus and scan the beam, as well as correct its shape. A typical arrangement of the main components of an SEM is schematically shown in FIG. 1. Electron source 1 generates an electron beam 2, shown as having an envelope 3 spread about axis 4, and which is directed toward sample 5. Beam 2 is controlled by gun condenser lens 7, beam aligners 9, aperture 11, and objective lens 13. A Wien filter 15 may be located between the aperture 11 and the objective lens 13 so as to deflect the charged particle emitted from the target 5 to a detector 17, which may be located between the aperture 11 and the Wien filter 15. The function of these components is well known. SEMs contain many other well known components to control the beam and perform other vital functions that are not described herein to avoid unduly lengthening and complicating the description of the present invention. It is to be understood that SEMs can contain more than one of any of the components described herein. Also, the positions of the various components need not be as shown in FIG. 1, which is presented for illustrative purposes rather than accuracy.

The envelope 3 of beam shown in FIG. 1 is a typical envelope. Crossover point 19 is controlled by gun condenser lens 7. (The term "crossover" is used herein to refer to where the majority of electrons cross axis 4, which occurs where envelope 3 shrinks to a minimal diameter.) The vertical location of crossover point 19 can be set anywhere all the way down to the sample 5. However, it typically appears generally as illustrated in FIG. 1. It is readily apparent that the beam envelope spreads out from the crossover point 19 until it is focused onto sample 5 by the powerful objective lens 13.

It is known that Wien filters can be used to advantage in an SEM for deflecting the otherwise difficult to detect on-axis and near-on-axis secondary electrons toward the detector, as disclosed in U.S. Pat. No. 4,658,136. Briefly, a Wien filter utilizes electrodes to create an electric field and magnetic poles to create a magnetic field. The two fields apply equal and opposite forces to electrons in the incident beam, so that it is not deflected. However, due to its opposite direction of travel, a secondary electron is affected by the magnetic field force in the same direction as the electric field force and, thus, is deflected. In practice, however, Wien filters have not been widely used for this purpose in an SEM because known designs "degrade the resolution due to the aberrations which are caused to the primary beam", (Murack, et al., J. Vac. Sci. Technol. B. Vol. 17, No. 6).

FIG. 1 shows a Wien Filter at the approximate relative position in the beam column where it would be placed in order to deflect emitted particles to the detector 17. When particles pass through the Wien filter 15 with the envelope 3 shaped as shown in FIG. 1, the incident beam resolution is adversely affected by two factors. Firstly, the electric and magnetic fields are not uniform away from axis 4. Consequently, the off-axis electrons within envelope 3 are subject to aberrations which are manifested by creating a larger spot size and, therefore, lower resolution. Secondly, the electrons that pass through the Wien filter 15 at a relatively substantial angle, which occurs with a beam envelope 3 shaped as shown, have a transverse velocity component that creates deflections by the magnetic field that are not in the direction of the electric field, and therefore cannot be canceled by it, which also acts to undesirably increase the spot size and decrease resolution. Although the objective lens 13 is quite strong, it cannot compensate for the aberrations caused by the Wien filter 15 in the typical system shown in FIG. 1.

SUMMARY OF THE INVENTION

One object of the present invention is to improve the resolution of an electron beam that impacts a sample being imaged where a Wien filter is employed to facilitate detecting emitted particles.

A further object of the present invention is to provide improved resolution for SEMs or the like which use the Wien filter.

Another object of the present invention is to minimize aberrations caused by a Wien filter in an SEM or the like.

Still another object of the present invention is to locate a crossover point in a particle beam envelope so as to improve the detection characteristics of the instrument involved.

These and other objects are attained in accordance with one aspect of the invention directed to an apparatus for utilizing a focused beam of charged particles. A beam of charged particles is produced and directed toward a target. The beam is controlled to form an envelope of predetermined configuration having at least one crossover point. A filter means, such as a Wien filter, is provided through which the beam passes. The beam is controlled such as to position the crossover point within the filter means.

Another aspect of the invention is directed to an apparatus for utilizing focused beams of charged particles, including a target and a particle source directing a beam of the particles to travel from the source to the target and forming a beam envelope. A Wien filter is provided through which the beam passes, and an objective lens, through which the beam passes, is located between the Wien filter and the target. At least one deflector, through which the beam passes, is between the particle source and the Wien filter, and it is effective to produce in the envelope a beam crossover point within the Wien filter.

Yet another aspect of the invention is directed to a method for imaging a target utilizing a focused beam of charged particles. A beam of charged particles is produced and directed toward the target. A filter is provided through which the beam passes. The beam is controlled to form an envelope of predetermined configuration having at least one crossover point, and the crossover point is positioned within the filter.

BRIEF DESCRIPTION OF THE DRAWINGS

To the accomplishment of the above, and to such other objects as may hereinafter appear, the present invention relates to the arrangement of a beam deflection system including a Wien filter, as defined in the appended claims and as described in this specification, taken together with the accompanying drawings, in which:

DETAILED DESCRIPTION OF THE PREFERRED EMBODIMENT

We have discovered that the resolution problem produced by the Wien filter in systems of the type under discussion can be greatly ameliorated by causing the envelope of the emitted beam, as it passes from electron source 1 to sample 5, to have a crossover point within, and preferably centered within, the Wien filter itself. When that is done, the aberrations produced by the Wien filter are so attenuated that the objective lens 13 is strong enough to substantially compensate for them. By adding an additional beam-focusing instrumentality, and appropriately energizing it, a greatly improved system resolution is obtained.

Figure 1:
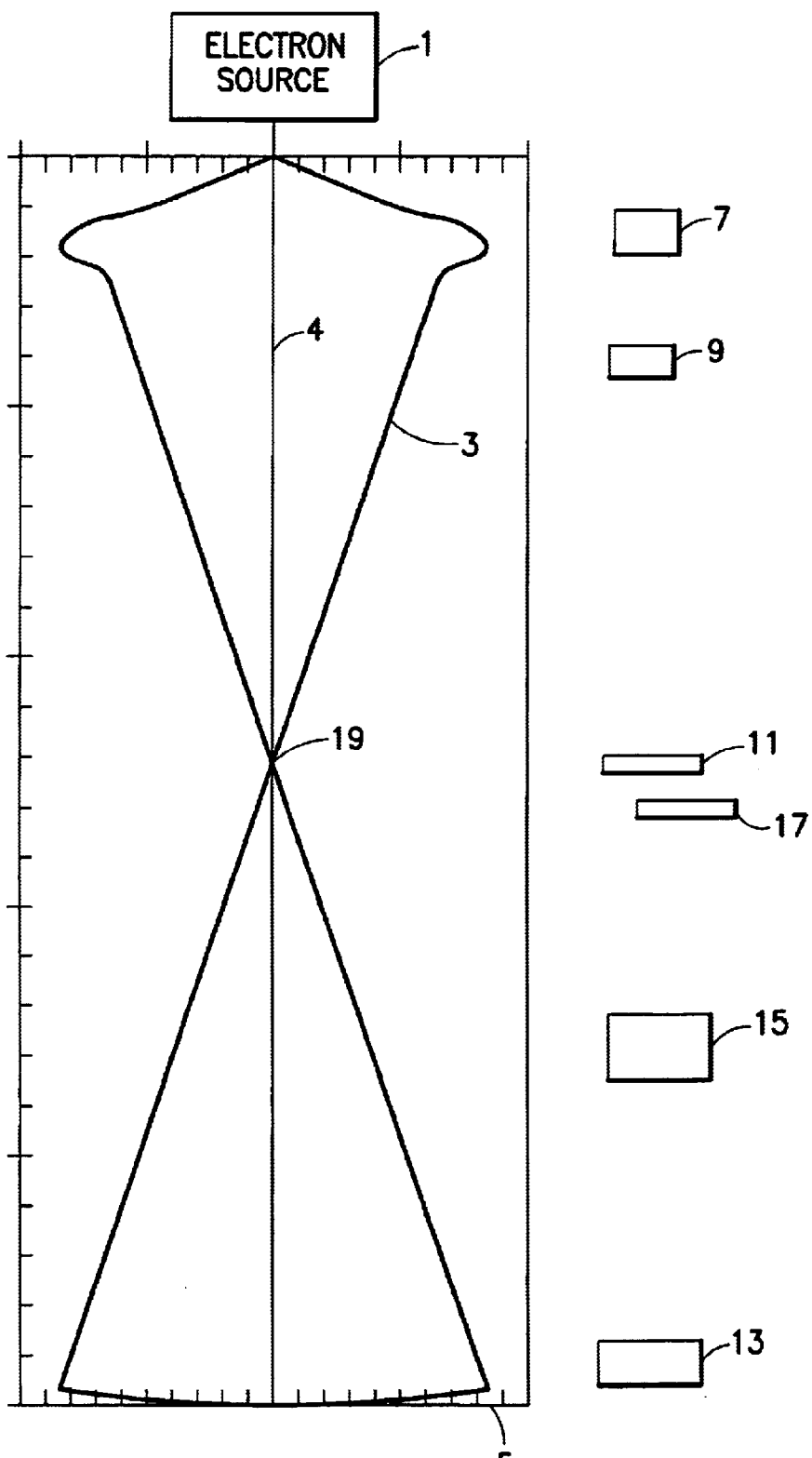
FIG. 1 schematically depicts a typical SEM system of the prior art utilizing a Wien filter.
Figure 2:
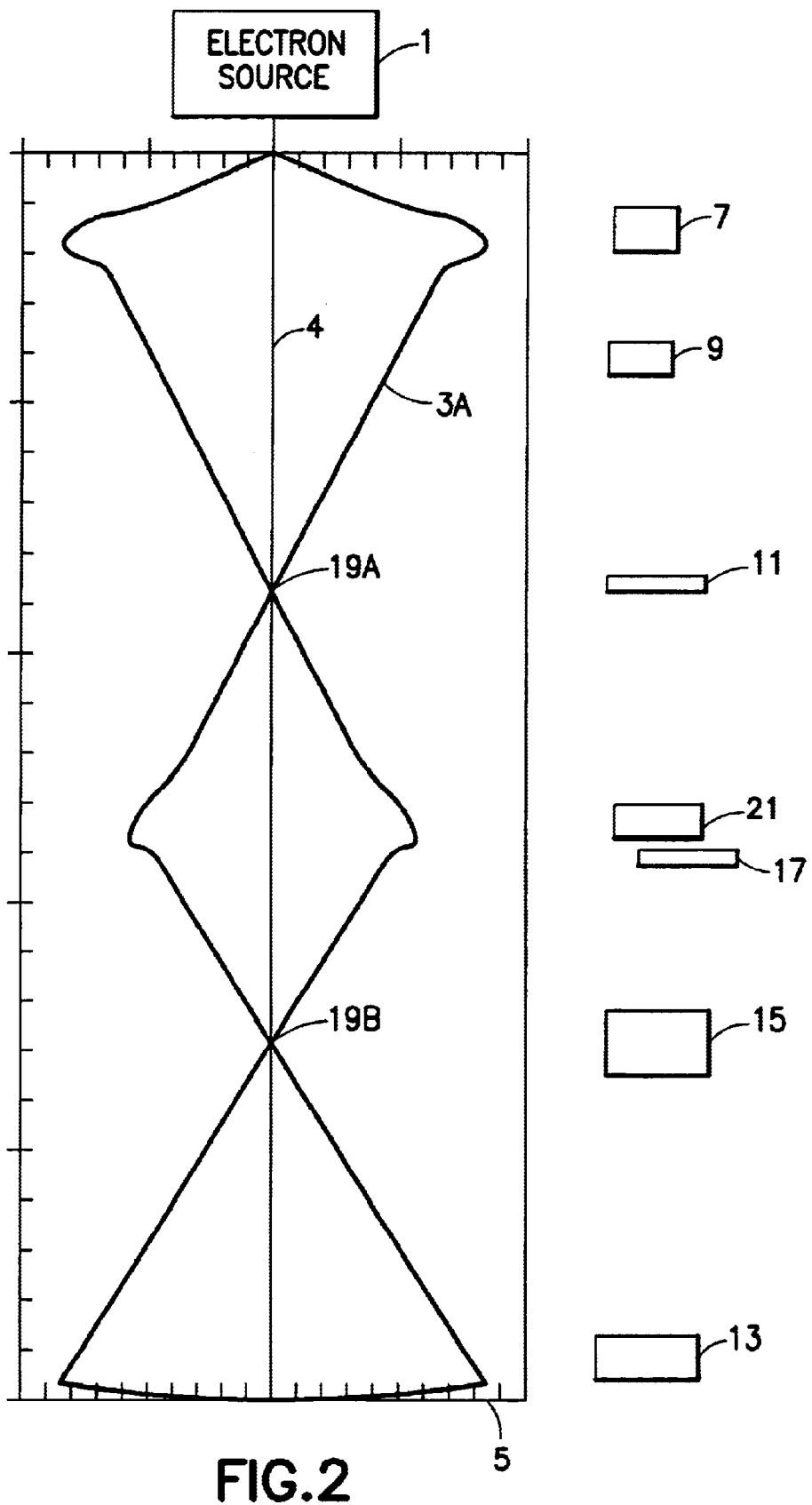
FIG. 2 schematically depicts an SEM system, including a Wien filter, improved in accordance with the present invention.

As shown in FIG. 2, an intermediate lens 21 is added to the system of FIG. 1. Intermediate lens 21 is preferably an electrostatic lens because the field of such a lens is easier to isolate from the field in the region of the detector 17, even if the detector is close to the lens 21, thereby preventing dispersion of the emitted electrons. However, a magnetic lens can be used for lens 21 when a higher resolution is desired, although a larger separation is necessary between such a magnetic lens and the detector 17.

The gun condenser lens 7 and the intermediate lens 21 are so energized, and the aperture 11 is so located between the lenses 7 and 21, that the beam envelope 3A is caused to assume a different shape (generally referred to as deflected by a deflector) from that shown in FIG. 1, with a crossover point 19A located in the vicinity of the aperture 11, but with an additional crossover point 19B located within the vertical confines of the Wien filter 15. The crossover point 19B is preferably located on axis 4 and essentially midway between the upper and lower ends of the passage which is traversed by the incident beam through the Wien filter 15. Alternatively, crossover point 19B should be positioned on axis 4 in the lower half of the Wien filter, but as close as possible to the midway point.

It has been found that using the lens 21 to produce the crossover 19B within the Wien filter 15 has the overall effect of keeping the electron beam envelope closer to the axis 4, which in itself minimizes aberration.

There is another significant advantage to the system of the present invention in locating the crossover point 19B in the middle of the Wien filter 15. Since the Wien filter is essentially a set of deflectors, the deflection of an axial incoming beam appears to originate at the center of the filter. In an idealized scenario, the crossover point 19B in the Wien filter 15 is a virtual object for the final image, namely the spot on the sample formed by the primary beam. As a result, the Wien filter can be adjusted to optimize the path of the beam through the objective lens, to maximize intensity and minimize aberrations, without shifting the position of the final image on the sample.

It is recognized that producing the crossover point 19B within the Wien filter will produce some beam dispersion below the Wien filter. However, the objective lens 13, which is the most powerful lens in the column, is strong enough to refocus the beam and provide the required resolution.

It will be appreciated that what is shown in FIGS. 1 and 2 is not only schematic but also not done to scale, that not all of the elements of an SEM are illustrated but only those truly relevant to the instant invention and that it is well within the ability of those with ordinary skill in the SEM art to determine and design the particular structural arrangement and electrical instrumentalities to produce the lens, deflection and aperture functions of the elements disclosed. Indeed, although the description of the invention presented above describes only three deflectors or lenses (7, 9 and 13) in addition to the Wien filter as shown, proper beam deflection could be attained with a smaller or greater number of deflectors, or with deflectors differently positioned than shown in the figures. It is the location of the crossover point 19B within the Wien filter 15 that produces the desired improvement in system resolution, and those skilled in the art know many ways for producing and locating that crossover point.

Although only a single embodiment of the present invention has been specifically disclosed above, various modifications thereto will be readily apparent to anyone with ordinary skill in the art. All such modifications are intended to fall within the scope of the present invention as defined in the following claims.

We claim:

1. An apparatus for utilizing a focused beam of charged particles, comprising; means for producing a beam of charged particles directed toward a target, means for controlling said beam to form an envelope of predetermined configuration having at least one crossover point, a filter means through which said beam passes, wherein said means for controlling the beam positions said crossover point within said filter means, and wherein said beam has an axis, wherein said beam passes through said filter means over a given axial distance, and wherein said controlling means positions said crossover point within a vertically lower half of said axial distance.

2. The apparatus of claim 1, wherein said filter means is a Wien filter.

3. The apparatus of claim 2, wherein said beam has an axis, and wherein said controlling means positions said crossover point substantially on said beam axis.

4. The apparatus of claim 3, wherein said filter means has an axis in substantial alignment with said beam axis.

5. The apparatus of claim 1, wherein said filter means has an axis in substantial alignment with said beam axis.

6. The apparatus of claim 2, wherein said controlling means positions said crossover point near a mid-point of said axial distance.

7. The apparatus of claim 6, wherein said filter means has an axis in substantial alignment with said beam axis.

8. The apparatus of claim 2, wherein said controlling means positions said crossover point substantially on said axis and near the mid-point of said axial distance.

9. The apparatus of claim 8, wherein said filter means has an axis in substantial alignment with said beam axis.

10. An apparatus for utilizing a focused beam of charged particles, comprising:

means for producing a beam of charged particles directed toward a target, means for controlling said beam to form an envelope of predetermined configuration having at least one crossover point, a filter means through which said beam passes, wherein said means for controlling the beam positions said crossover point within said filter means, and wherein said controlling means controls said beam envelope to have a second crossover point between said beam producing means and said filter means.

11. The apparatus of claim 10, wherein said beam has an axis, and wherein said second crossover point is substantially on said beam axis.

12. An apparatus for utilizing focused beams of charged particles, comprising:

a target, a particle source directing a beam of the particles to travel from said source to said target and forming a beam envelope, a Wien filter through which said beam passes, an objective lens through which said beam passes, and located between said Wien filter and said target, at least one deflector between said particle source and said Wien filter through which said beam passes and effective to produce in said envelope a beam crossover point within said Wien filter, and wherein said beam has an axis, wherein said beam passes through said Wien filter over a given axial distance, and wherein said deflector positions said crossover point within a vertically lower half of said axial distance.

13. The apparatus of claim 12, wherein said deflector comprises at least one lens.

14. The apparatus of claim 13, wherein said beam has an axis, and wherein said deflector positions said crossover point substantially on said beam axis.

15. The apparatus of claim 14, wherein said Wien filter has an axis in substantial alignment with said beam axis.

16. The apparatus of claim 12, wherein said Wien filter has an axis in substantial alignment with said beam axis.

17. The apparatus of claim 13, wherein said deflector positions said crossover point near a mid-point of said axial distance.

18. The apparatus of claim 17, wherein said Wien filter has an axis in substantial alignment with said beam axis.

19. The apparatus of claim 13, wherein said deflector position said crossover point substantially on said axis and near the mid-point of said axial distance.

20. The apparatus of claim 19, wherein said Wien filter has an axis in substantial alignment with said beam axis.

21. An apparatus for utilizing focused beams of charged particles, comprising:

a target, a particle source directing a beam of the particles to travel from said source to said target and forming a beam envelope, a Wien filter through which said beam passes, an objective lens through which said beam passes, and located between said Wien filter and said target, at least one deflector between said particle source and said Wien filter through which said beam passes and effective to produce in said envelope a beam crossover point within said Wien filter, and wherein said deflector controls said beam envelope to have a second crossover point between said particle source and said Wien filter.

22. The apparatus of claim 21, wherein said beam has an axis, and wherein said second crossover point is substantially on said beam axis.

23. The apparatus of claim 12, further comprising an aperture through which said beam passes, wherein said envelope also has a crossover point in the vicinity of said aperture.

24. A method for imaging a target utilizing a focused beam of charged particles, comprising:

producing a beam of charged particles with a beam producing means, directing said beam toward the target, providing a filter through which said beam passes, controlling said beam to form an envelope of predetermined configuration having at least one crossover point, and positioning said crossover point within said filter, wherein said beam passes through said filter over a given axial distance, and wherein said crossover point is positioned within a vertically lower half of said axial distance.

25. The method of claim 24, wherein said beam has an axis, and wherein said filter is a Wien filter having an axis in substantial alignment with said beam axis.

26. The method of claim 25, wherein said crossover point is positioned substantially on said beam axis.

27. The method of claim 24, wherein said crossover point is positioned near a mid-point of said axial distance.

28. The method of claim 24, wherein said crossover point is positioned substantially on said axis and near the mid-point of said axial distance.

29. A method for imaging a target utilizing a focused beam of charged particles, comprising:

producing a beam of charged particles with a beam producing means, directing said beam toward the target, providing a filter through which said beam passes, controlling said beam to form an envelope of predetermined configuration having at least one crossover point, and positioning said crossover point within said filter, wherein said beam envelope is controlled to have a second crossover point between said beam producing means and said filter.

30. The method of claim 29, wherein said beam has an axis, and wherein said second crossover point is positioned substantially on said beam axis.

31. The method of claim 29, further comprising the step of providing an aperture through which said beam passes, wherein said second crossover point is positioned in the vicinity of said aperture.

* * * * *